United States Patent [19]

Lincoln et al.

[11] 4,294,669
[45] Oct. 13, 1981

[54] PROCESS FOR PLATING SELECTED METAL AREAS

[75] Inventors: Howard P. Lincoln, North Warren; Donald M. Reddinger, Russell, both of Pa.

[73] Assignee: GTE Products Corporation, Stamford, Conn.

[21] Appl. No.: 185,091

[22] Filed: Sep. 8, 1980

[51] Int. Cl.³ .............................................. C25D 5/02
[52] U.S. Cl. .................................. 204/15; 204/224 R
[58] Field of Search ............... 204/15, 17, 18.1, 224 R

[56] References Cited

U.S. PATENT DOCUMENTS 3,835,017  9/1974  Mentone et al. ................. 204/224 R
3,974,056  8/1976  Jogwick ............................. 204/15 X Primary Examiner—Evan K. Lawrence
Attorney, Agent, or Firm—Thomas H. Buffton

[57] ABSTRACT

An apertured plating mask having a polyurethane layer thereon to enhance the sealing thereof to a metal has been provided. The plating mask has a substantially smooth layer for contact with a metal as well as a polyurethane covering of the inner perimeter of the apertures of the plating mask whereby definition of selected areas for plating is enhanced. The apertured plating mask is fabricated by a unique molding process wherein a fabricated mask blank is positioned in a mold member, polyurethane is poured through and over the mask blank, cured and treated in the mold member to provide the apertured mask with a polyurethane layer having a substantially smooth surface. Also, a process and apparatus are provided for plating selected areas of a metal wherein a metal is contacted on one surface with a rubber-covered rigid plate and on the opposite surface with an apertured plating mask having a layer of polyurethane with a smooth surface thereon. A plating solution is applied through the apertures of the plating mask to selected areas of the metal as defined by the polyurethane and energized to provide the desired plated area.

3 Claims, 5 Drawing Figures

PROCESS FOR PLATING SELECTED METAL AREAS

CROSS REFERENCE TO OTHER APPLICATIONS

The following concurrently filed applications relate to apparatus and process disclosed in the present application: Ser. No. 185,094 entitled "Molded Selective Plating Mask"; Ser. No. 185,093 entitled "Plating Mask Fabricating Process"; Ser. No. 185,092 entitled "Apparatus For Selective Metal Plating".

TECHNICAL FIELD

This invention relates to a process for selective plating of specified metal areas using an apertured mask with a polyurethane layer.

BACKGROUND ART

In the art of selectively plating specific areas of a metal such as the formation of lead frames or the application of contacts to connectors, it is a common practice to provide a metal strip which is indexed into position and stopped. A rubber gasket material on a rigid support is forced tightly against one surface of the metal strip and an apertured plating mask contacts an opposite surface of the metal strip. The apertured plating mask forms a seal with the metal strip and a plating solution is applied to the selected areas of the metal strip through the apertures of the apertured plating mask. Following, the rubber gasket material and the apertured plating mask are moved away from the metal strip which is indexed forward and the cycle repeated.

Although the above-described process and apparatus for plating specific areas of metal have been and still are utilized in numerous applications, it has been found that there are other applications which require revisions and adjustments to the known and established techniques. For example, it has been found that the deposition of silver on a specific area of copper requires enhanced apertured mask to metal sealing but will not tolerate undue distortion of the metal due to added pressure.

On the one hand, an apertured mask which is relatively rigid, such as a glass-filled epoxy mask for example, does not provide the necessary mask to metal sealing and offers little or no opportunity for mask repair due to wear or damage. On the other hand, an apertured mask which is relatively soft, such as a mask having a soft rubber sheet covering, tends to lack the necessary toughness for repetitive use and deform under operational pressure and temperature conditions. Moreover, the relatively soft material undesirably exhibits relatively rapid wear characteristics which offer little or no repair capabilities.

SUMMARY OF THE INVENTION

The above-mentioned deficiencies are overcome in the present invention by providing a process for plating selected metal areas wherein the metal is contacted on one surface by a rubber-covered rigid plate, contacted on an opposite surface by an apertured mask comprising an apertured mask blank having a layer of polyurethane thereon, subjected to a plating material applied through the apertured mask to the selected areas, and energized to effect the desired plating.

BEST MODE FOR CARRYING OUT THE INVENTION

For a better understanding of the present invention, together with other and further objects, advantages and capabilities thereof, reference is made to the following disclosure and appended claims in conjunction with the accompanying drawings.

Figure 1:
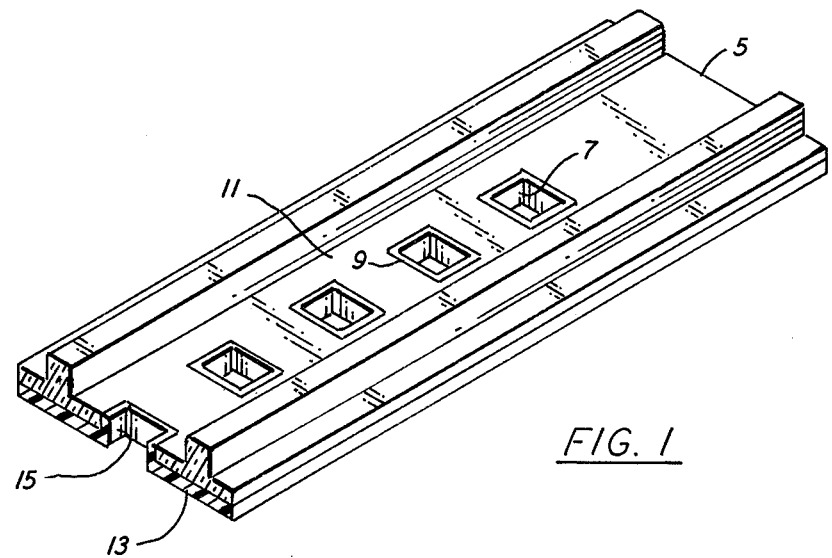
FIG. 1 is an isometric view of an apertured mask blank and affixed layer of polyurethane.
Figure 2:
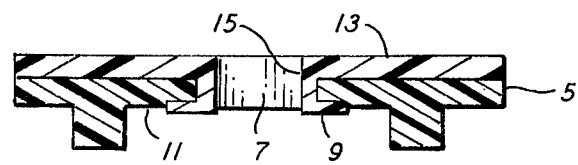
FIG. 2 is a cross-sectional view of the embodiment of FIG. 1.

Referring to the drawings, FIGS. 1 and 2 illustrate an apertured mask which includes a mask blank 5, preferably formed from a glass-filled epoxy, and including a plurality of spaced apertures 7. Each of the spaced apertures 7 has a recessed portion 9 on one surface 11 of the mask blank 5. Affixed to the opposite surface of the mask blank 5 is a layer of polyurethane 13. This polyurethane also covers the inner perimeter 15 of each of the aperture 7 and extends into the recessed portion 9 on the one surface 11 of the mask blank 5.

The polyurethane 13 is treated, as by grinding for example, to have a substantially smooth surface. This substantially smooth surface in conjunction with the polyurethane on the inner perimeter 15 of each of the apertures is utilized to provide an enhanced seal to a metal and to define the selected areas which are to be plated. Thus, the polyurethane 13 replaces prior known relatively rigid and relatively pliable materials previously employed as mask materials.

Figure 3:
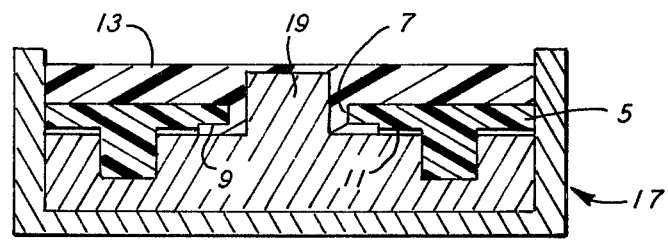
FIG. 3 is a cross-sectional view mask blank, polyurethane layer and mold for fabricating the structure of FIG. 2.

As to the fabrication of the apertured mask of FIGS. 1 and 2, FIG. 3 illustrates a mold member 17 of a form to receive the mask blank 5. The mold member 17 is sprayed with a plastic release agent and the mask blank 5 is positioned within the mold member 17. Preferably, a release agent known as RP 78 manufactured by CIBA-GEIGY Company of Lansing, Mich. is utilized with polyurethane materials.

A polyurethane material comprising a resin and hardener such as manufactured by Ren Plastics of the above-mentioned CIBA-GEIGY Company, is prepared and degassed by a vacuum in the range of about 25 to 29 inches of mercury. This de-gassed polyurethane is then poured into the mold member 17 through the spaced apertures 7 of the mask blank 5. Each of the apertures 7 is of a design such that a space in the range of about 0.005 to 0.030 inches is provided between the mask blank 5 and an upstanding lug 19 of the mold member 17.

As a result, the polyurethane is disposed not only between the mask blank 5 and the upstanding lug 19 of the mold member 17 but also fills the recessed portion 9 of the surface 11 while covering the opposite surface of the mask blank 5. Thus, the polyurethane includes a polyurethane layer 13 on one surface of the mask blank 5, polyurethane extending around the inner perimeter 15 of the mask blank 5 for each of the aperture 7, and polyurethane filling each of the recessed portions 9 to enhance the attachment of the polyurethane to the mask blank 5.

Then the mold member 17 containing the polyurethane-covered mask blank 5 is placed in a chamber and de-gassed in a vacuum of about 25 to 29 inches of mercury for a period in the range of about 5 to 10-minutes. Thereafter the mold member 17 and polyurethane-covered mask blank 5 contained therein are removed from the chamber and allowed to cure at atmospheric conditions for a period which may extend from a day to a week depending upon the configuration and composition of the polyurethane.

Following curing, treatment of the cured polyurethane provides a substantially flat polyurethane layer 13 suitable for establishment of a seal 3 on a metal. Preferably, the polyurethane is treated by grinding to effect the desired flat polyurethane layer 13. Also, the treatment is of an amount sufficient to reduce the thickness of the polyurethane and expose the upstanding lug 19 of the mold member 17. In this manner, the desired apertures 7 are achieved and these apertures 7 include a polyurethane perimeter which defines the boundries of the selected areas for exposure and which forms a seal with a metal. Moreover, the treatment or grinding of the polyurethane in conjunction with the configuration of the mold member 17 preferably provides a polyurethane layer 13 having a smooth surface and a thickness in the range of about 0.020 to 0.080 inches.

Upon removal from the mold member 17, there is provided a mask blank 5 having a plurality of spaced apertures 7. The inner perimeter 15 of the mask blank 5 forming the apertures 7 is covered with a layer of polyurethane while the recessed portions 9 are filled with polyurethane. Moreover, a layer of polyurethane 13 having a substantially smooth surface and of a thickness in the range of about 0.020 to 0.080 inches is affixed to the surface of the mask blank 5 opposite to the surface 11 having the polyurethane-filled recessed portions 9.

Figure 4:
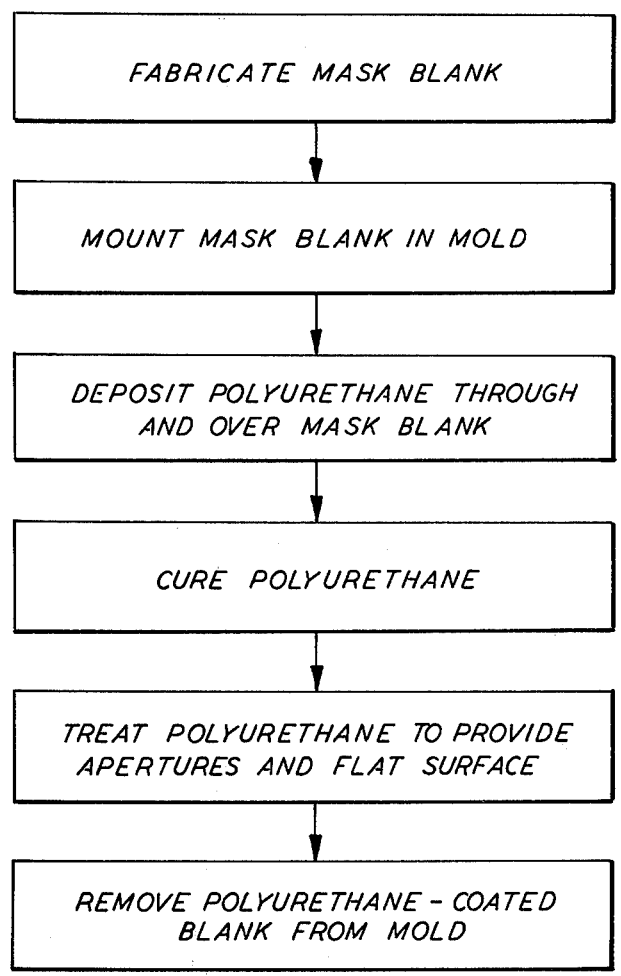
FIG. 4 is a block diagram illustrating a preferred process for fabricating the apertured mask with affixed polyurethane of FIG. 2.

As set forth in the flow diagram of FIG. 4, a process for fabricating a plating mask includes the forming and locating of an apertured mask blank in a mold member. Polyurethane is deposited through and over the mask blank and forms a layer on at least one surface of the mask blank as well as a covering of the inner perimeter of the mask blank forming the apertures therethrough. The polyurethane is allowed to set while in the mold member and then treated to provide a substantially flat surface as well as apertures therethrough. Thereafter, the mask blank having the polyurethane on at least one surface and surrounding the inner perimeter of the apertures of the mask blank is removed from the mold member and in a condition suitable for use in a metal plating operation.

As to a process for plating selected areas of a metal such as the deposition silver on a selected area of copper for use in a lead frame structure for example, a rigid plate member covered with a softer rubber-sheet material is placed in contact with one surface of the metal to be plated. Also, a mask blank having a layer of polyurethane thereon is placed in contact with an opposite surface of the metal to be plated.

The mask blank has a plurality of apertures which have inner perimeter covered with polyurethane surrounding the selected areas for plating. A plating solution is applied to the selected areas of the metal by way of the polyurethane-lined apertures and this solution is energized to effect deposition on the selected areas of the metal. Then, the contact between the rubber-covered rigid plate member and metal as well as the contact between the polyurethane covered apertured mask and the metal is removed and the metal is moved to provide another similar cycle.

Figure 5:
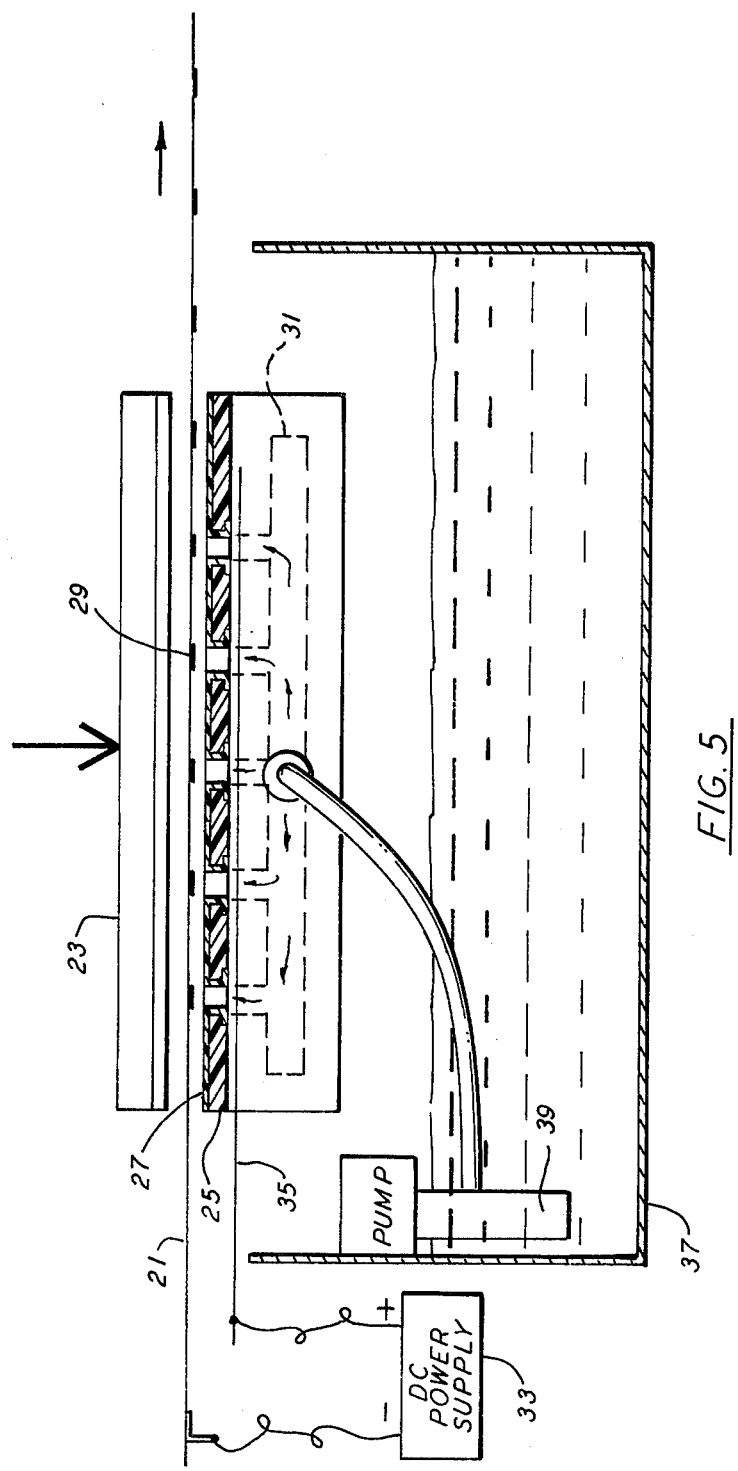
FIG. 5 is a diagrammatic illustration of one form of apparatus for plating selected metal areas utilizing the mask of FIG. 2.

If effecting the above-mentioned plating process, a preferred form of apparatus is illustrated in FIG. 5. Herein, a metal strip 21 to be plated is positionally located intermediate a rubber-covered rigid plate member 23 and an apertured mask member 25 having a layer of polyurethane 27 formed to contact the metal strip 21 and also extending through the apertures 29 of the apertured mask member 25.

A manifold 31 provides a plating solution which is applied through the apertures 29 of the polyurethane-covered mask member 25 to the selected areas of the metal strip 21. A power supply 33 is coupled to the metal strip 21 and to an anode electrode 35 to provide energization of the plating solution whereby the desired plating of the selected areas of the metal strip 21 is effected. A container 37 including a pump 39 provides a capability for retrieving and returning the plating solution to the manifold for further utilization in a plating process.

While there has been shown and described what is at present considered the preferred embodiments of the invention, it will be obvious to those skilled in the art that various changes and modifications may be made therein without departing from the invention as defined by the appended claims.

INDUSTRIAL APPLICABILITY

Thus, there has been provided a unique apertured mask having a layer of polyurethane thereon and particularly suited to the plating of specific areas of a metal. This apertured mask structure provides an enhanced seal with the metal as well as enhanced definition of the specific plating area. Also, the polyurethane covered apertured mask provides improved repairability and a reduced tendency to a build up of the plating metal as compared with a rigid structure. Moreover, the wearability toughness, repairability and reduced deformation of the polyurethane mask structure is an advantage over prior known relatively soft rubber-mask structures.

Further, the above-mentioned apertured mask having a layer of polyurethane thereon is fabricated by a unique process whereby the structure is molded by depositing the polyurethane through and over a blank support structure. Also, the structure is not only cured but also treated in the mold member to provide the desired smooth surface thereon necessary to enhanced sealing to a metal.

Additionally, the above-mentioned apertured mask having a polyurethane layer is especially suitable to a process for plating selected areas of a metal. For example, it has been found that the enhanced mask to metal seal and selected area definition provided by the polyurethane structure provides an enhanced silver plating on a copper metal. Utilizing this particular mask structure is a plating process has provided a plating capability which, in so far as is known, was unobtainable with other known structures and processes. Moreover, the plating apparatus is readily repairable and replaceable at a nominal cost since the polyurethane coating, rather than the whole support structure, becomes the item to be replaced.

We claim:

1. In a process for plating selected areas of a metal wherein a rigid plate covered with a resilient material is placed in contact with one surface of the metal and a plating solution is energized and applied to the selected areas of the opposite surface of the metal, the improvement comprising the steps of contacting the opposite surface of the metal with an apertured mask comprising a mask blank having a plurality of apertures and having a layer of polyurethane on one surface for forming a seal with said metal, a layer of polyurethane affixed to the inner periphery of the apertures of said apertured mask, and a layer of polyurethane in a recessed portion of an opposite surface of said apertured mask blank surrounding each one of said apertures and applying said plating solution to said selected areas of said metal through said apertures of said apertured mask.

2. The process of claim 1 including the step of treating said layer of polyurethane on said apertured mask prior to said contracting of the metal with the mask to provide a substantially flat polyurethane surface contacting said metal.

3. The process of claim 1 wherein said layer of polyurethane on said one surface of said apertured mask blank is treated prior to said contacting of the metal with the mask to provide a substantially flat surface layer of polyurethane having a thickness in the range of about 0.020 to 0.080 inches.

* * * * *